(12) United States Patent
Nakagawa

(10) Patent No.: US 11,566,813 B2
(45) Date of Patent: Jan. 31, 2023

(54) MEMBER WITH HOLES, PERMEABLE MEMBER, AND PERMEABLE COVER

(71) Applicant: DAIKIN INDUSTRIES, LTD., Osaka (JP)

(72) Inventor: Ryouichi Nakagawa, Osaka (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

(21) Appl. No.: 17/465,634

(22) Filed: Sep. 2, 2021

(65) Prior Publication Data

US 2021/0396426 A1    Dec. 23, 2021

Related U.S. Application Data

(63) Continuation of application No. PCT/JP2020/006766, filed on Feb. 20, 2020.

(30) Foreign Application Priority Data

Mar. 8, 2019  (JP) .............................. JP2019-043158

(51) Int. Cl.
| | | |
|---|---|---|
| *B32B 3/24* | (2006.01) | |
| *F24F 13/20* | (2006.01) | |
| *H04R 1/02* | (2006.01) | |
| *H05K 5/03* | (2006.01) | |
| *F24F 1/58* | (2011.01) | |

(52) U.S. Cl.
CPC ................ *F24F 13/20* (2013.01); *F24F 1/58* (2013.01); *H04R 1/02* (2013.01); *H05K 5/03* (2013.01); *Y10T 428/24281* (2015.01)

(58) Field of Classification Search
CPC ..... Y10T 428/24273; Y10T 428/24479; B32B 3/266; H04R 1/023; F24F 13/20
See application file for complete search history.

(56) References Cited

U.S. PATENT DOCUMENTS

| | | | |
|---|---|---|---|
| 5,348,788 A | * | 9/1994 | White ..................... A61L 27/56 |
| | | | 428/338 |
| 5,851,334 A | | 12/1998 | Shikata et al. |
| 5,868,475 A | | 2/1999 | Shikata et al. |
| 5,957,553 A | | 9/1999 | Shikata et al. |

(Continued)

FOREIGN PATENT DOCUMENTS

| | | |
|---|---|---|
| CN | 102967988 A | 3/2013 |
| DE | 197 28 820 C1 | 10/1998 |

(Continued)

OTHER PUBLICATIONS

International Search Report of corresponding PCT Application No. PCT/JP2020/006766 dated May 26, 2020.

(Continued)

*Primary Examiner* — William P Watkins, III
(74) *Attorney, Agent, or Firm* — Global IP Counselors, LLP

(57) ABSTRACT

An air-permeable cover includes a substrate having a plurality of holes. The substrate has a first surface on which one end of each of the plurality of holes is open, and the first surface has a plurality of first protruding portions. The plurality of first protruding portions is arranged in regions between the plurality of holes on the first surface in accordance with an arrangement of the plurality of holes.

18 Claims, 11 Drawing Sheets

(56) References Cited

U.S. PATENT DOCUMENTS

| | | | |
|---|---|---|---|
| 2013/0050658 A1 | 2/2013 | Morohoshi | |
| 2014/0349079 A1* | 11/2014 | Chandrasekaran | ... A61F 13/625 24/442 |
| 2015/0290050 A1* | 10/2015 | Wada | ...................... B32B 37/10 156/196 |

FOREIGN PATENT DOCUMENTS

| | | |
|---|---|---|
| EP | 0 614 314 A1 | 9/1994 |
| EP | 2 565 709 B1 | 7/2016 |
| JP | 4-94011 A | 8/1992 |
| JP | 7-59184 A | 3/1995 |
| JP | 7-163441 A | 6/1995 |
| JP | 2019-195756 A | 11/2019 |

OTHER PUBLICATIONS

International Preliminary Report of corresponding PCT Application No. PCT/JP2020/006766 dated Sep. 23, 2021.
European Search Report of corresponding EP Application No. 20 76 9640.2 dated Oct. 5, 2022.

* cited by examiner

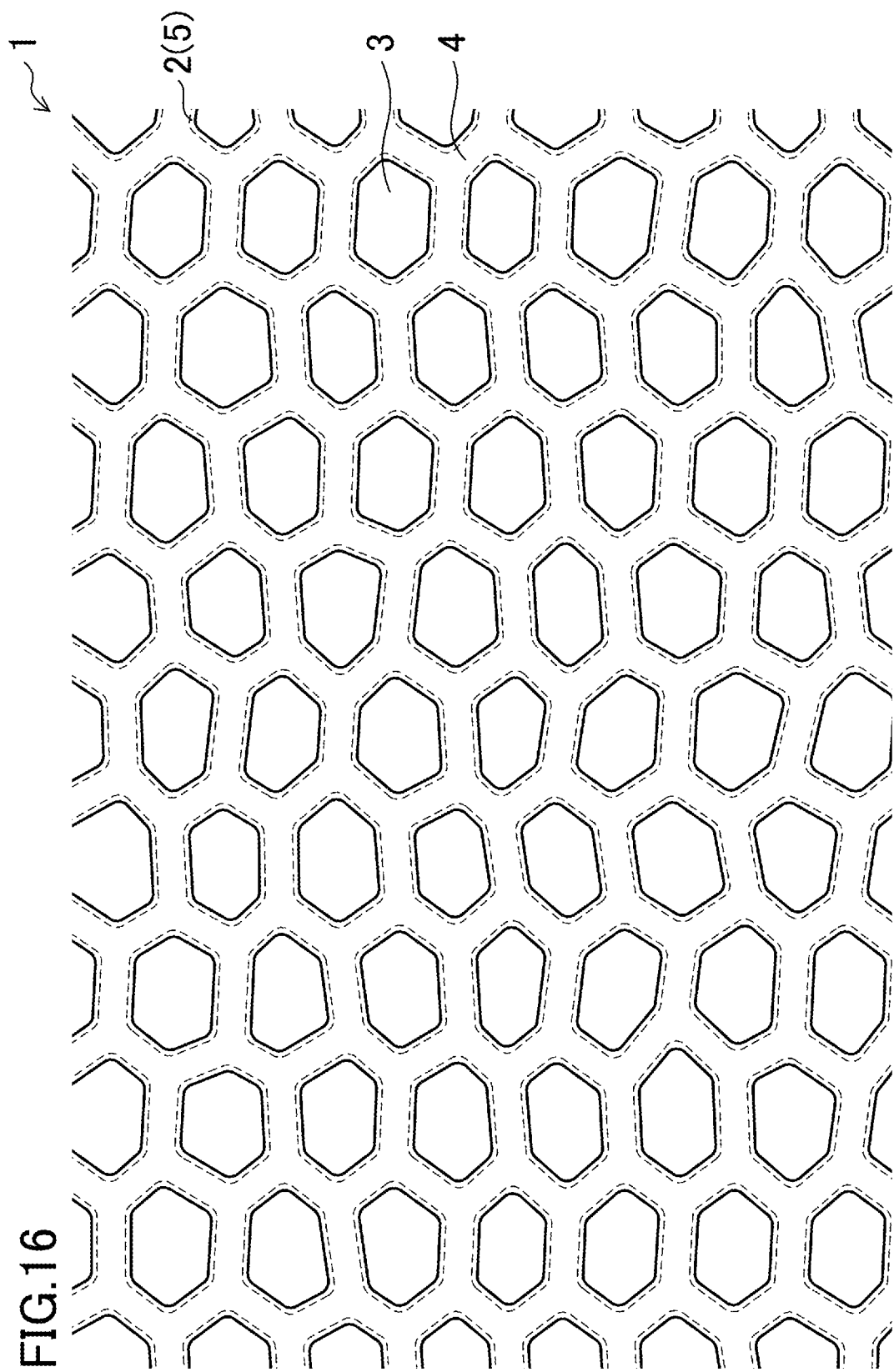

MEMBER WITH HOLES, PERMEABLE MEMBER, AND PERMEABLE COVER

CROSS-REFERENCE TO RELATED APPLICATIONS

This is a continuation of International Application No. PCT/JP2020/006766 filed on Feb. 20, 2020, which claims priority to Japanese Patent Application No. 2019-043158, filed on Mar. 8, 2019. The entire disclosures of these applications are incorporated by reference herein.

BACKGROUND

Field of Invention

The present disclosure relates to a perforated member, an air-permeable member, and an air-permeable cover.

Background Information

Perforated metal has been widely used as a protective cover having both air permeability and interior concealing properties. The use of the perforated metal as a protective cover enables protection of the inside of the cover while reducing exposure of the inside of the cover to the outside.

In addition to perforated metal, a cover obtained by providing multiple holes in a resin material is used. Japanese Unexamined Patent Publication No. H07-59184 discloses a method to make the perforated state invisible at a glance from the outward appearance by arranging multiple micro holes with a diameter smaller than the thickness of the resin material.

SUMMARY

A first aspect of the present disclosure is directed to an air-permeable cover including a substrate having a plurality of holes. The substrate has a first surface on which one end of each of the plurality of holes is open, and the first surface has a plurality of first protruding portions. The plurality of first protruding portions is arranged in regions between the plurality of holes on the first surface in accordance with an arrangement of the plurality of holes. An perforated member member may have the same configuration and include additional features.

BRIEF DESCRIPTION OF THE DRAWINGS

FIG. 16 is a plan view of a perforated member of another embodiment.

DETAILED DESCRIPTION OF EMBODIMENT(S)

Embodiments of the present disclosure will be described below with reference to the drawings. The embodiments below are merely exemplary ones in nature, and are not intended to limit the scope, applications, or use of the invention.

First Embodiment

Configuration of Perforated Member

Figure 1:
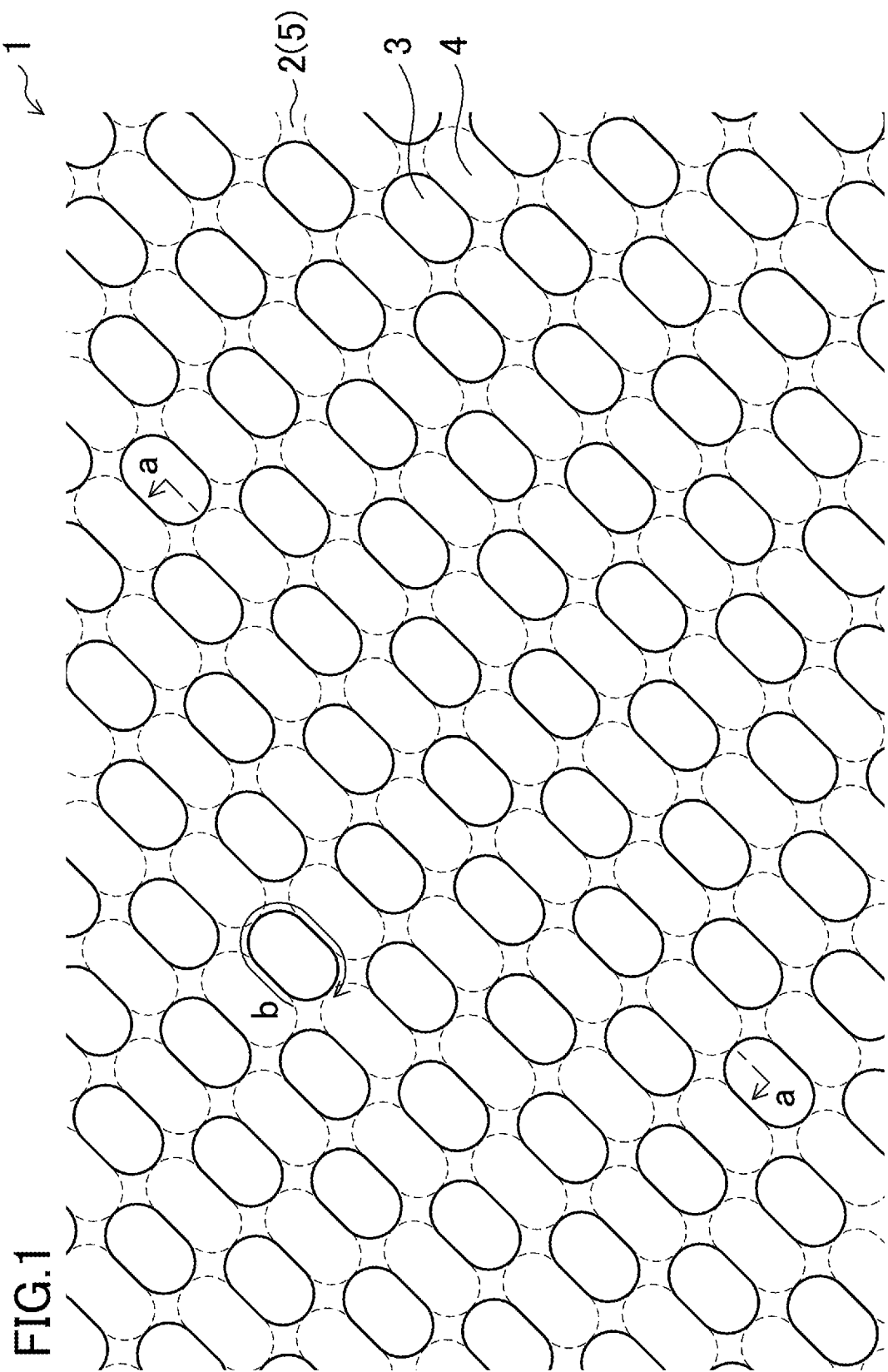
FIG. 1 is a plan view of a perforated member of a first embodiment.
Figure 2:
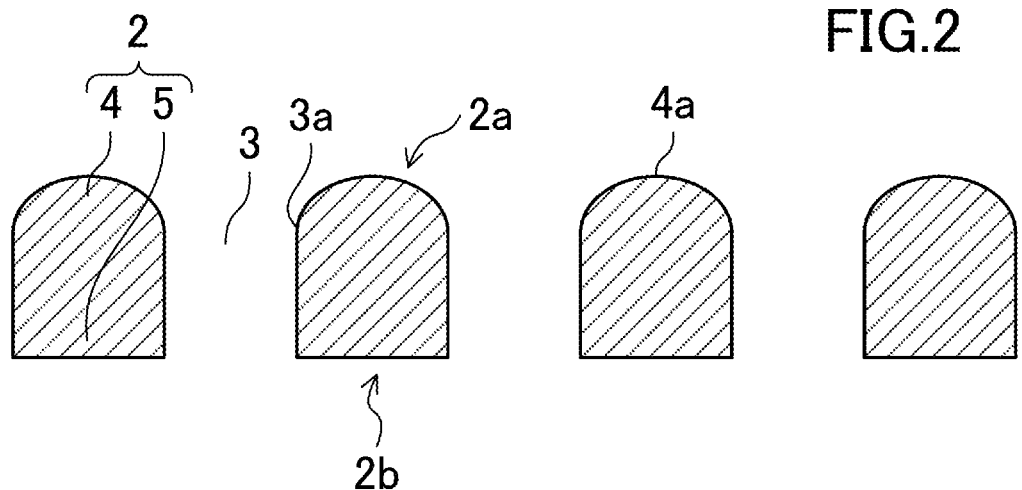
FIG. 2 is a cross-sectional view taken along line a-a shown in FIG. 1.

As shown in FIGS. 1 and 2, a perforated member (1) of the present embodiment includes a substrate (2) having a plurality of holes (3) regularly arranged in two dimensions. The material of the substrate (2) is, for example, resin. The holes (3) each have a rectangular opening shape with rounded corners and arc-shaped short sides, and are arranged zigzag. An opening edge (3a) of each of the holes (3) is rounded.

The substrate (2) has a first surface (2a) on which one end of each of the holes (3) is open, and the first surface (2a) has a plurality of first protruding portions (4). The first protruding portions (4) are regularly arranged in two dimensions in regions between the holes (3) on the first surface (2a) of the substrate (2) in accordance with the arrangement of the holes (3). In other words, the first protruding portions (4) are arranged with consideration of the arrangement of the holes (3). A top (4a) of each of the first protruding portions (4) is rounded.

The substrate (2) has a base (5) having the first protruding portions (4) provided thereon. The base (5) has a thickness equal to the minimum thickness of the substrate (2). The side of the base (5) opposite to the first protruding portions (4), i.e., a second surface (2b) on the side opposite to the first surface (2a) in the substrate (2) is a flat surface except for the regions where the holes (3) are formed.

In the present embodiment, the first protruding portions (4) are regularly arranged in two dimensions in accordance with the arrangement of the holes (3). Specifically, each of the first protruding portions (4) is arranged between adjacent holes (3), and one hole (3) is surrounded by four first protruding portions (4). When the arrangement pitch of the holes (3) is h and the arrangement pitch of the first protruding portions (4) is a, h=a.

Figure 3:
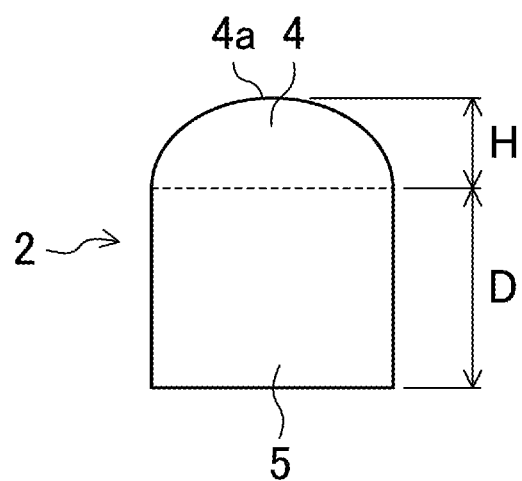
FIG. 3 shows a height of a first protruding portion and a thickness of a base in the perforated member of the first embodiment.

As shown in FIG. 3, when the height of the top (4a) of the first protruding portion (4) is H and the thickness of the base (5) of the first protruding portion (4) is D, H is equal to or higher than 20% of D. Specifically, when the holes (3) are formed in the substrate (2) at an opening ratio of about 55%, D may be 1.5 mm and H may be 0.8 mm.

Figure 4:
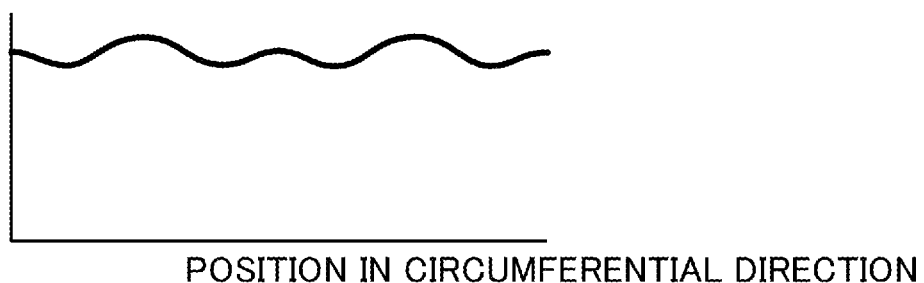
FIG. 4 shows a change in thickness of a substrate around holes in the perforated member of the first embodiment.

Further, each of the holes (3) is surrounded by four first protruding portions (4). Thus, the thickness of the substrate (2) is changed along the circumferential direction of the hole (3) (see an arrow b in FIG. 1), as shown in FIG. 4.

The height (H) of the top (4a) of each of the first protruding portions (4), the thickness (D) of the base (5), and the thickness of the substrate (2) are measured in a normal direction of the first surface (2a) of the substrate (2) (the same applies to the second and subsequent embodiments).

As described above, the perforated member (1) of the present embodiment is provided with the plurality of first protruding portions (4) in accordance with the arrangement of the plurality of holes (3). Thus, relatively large undulations are regularly formed on the first surface (2a) of the substrate (2), relative to the thickness of the substrate (2). Such a perforated member (1) can be manufactured by resin-molding using an injection method with a mold made based on D3 Texture (registered trademark), for example.

Advantages of First Embodiment

According to the perforated member (1) of the present embodiment described above, the first protruding portions (4) are arranged in regions between the holes (3) on the first surface (2a) of the substrate (2) in accordance with the arrangement of the holes (3). In other words, the first protruding portions (4) are arranged with consideration of the arrangement of the holes (3). The first protruding portions (4) arranged around the holes (3) allows narrowing a viewing angle at which an area beyond the substrate (2) is seen through the holes (3). In other words, when the perforated member (1) is viewed obliquely from the first surface (2a) of the substrate (2), the holes (3) are blocked by the first protruding portions (4). This enables providing the perforated member (1) having excellent interior concealing properties even with an increased opening ratio. When such a perforated member (1) is used as, for example, an exterior cover, internal components are less likely to be seen through the holes (3), which improves designability.

In addition, according to the perforated member (1) of the present embodiment, the diameters of the holes (3) are not decreased, but the first protruding portions (4) are provided around the holes (3). This increases the substantial depth of each of the holes (3) and improves the interior concealing properties of the perforated member (1). Therefore, as compared with a method such as that of Patent Document 1 where the hole diameter is reduced to make the perforated state invisible from the outward appearance, the perforated member (1) of the present embodiment is able to be manufactured without restrictions of the strength of the mold pin while the reduction in the opening ratio is suppressed.

In addition, in the perforated member (1) of the present embodiment, the first protruding portions (4) are provided in the regions between the holes (3) even when the opening ratio of the perforated member (1) is increased by forming multiple holes (3) or increasing the diameter of the holes (3). This improves the rigidity of the perforated member (1). This allows the perforated member (1) of the present embodiment to be manufactured without restrictions of the strength of the mold pin while the amount of the material such as resin of the substrate (2) is reduced, as compared with the case in which the thickness of the substrate (2) is made uniform to improve the rigidity of the perforated member (1).

In addition, in the perforated member (1) of the present embodiment, the first protruding portions (4) are provided on the first surface (2a) of the substrate (2). Thus, flat portions, depressions, or the holes (3) are surrounded by the first protruding portions (4), thereby forming dimple shapes on the first surface (2a). Therefore, the perforated member (1) applied to, for example, an air-permeable cover exhibits a rectifying effect on airflow in a direction parallel to the first surface (2a), thereby reducing intake/exhaust noises.

Further, in the perforated member (1) of the present embodiment, the holes (3) and the first protruding portions (4) are regularly arranged. This enables providing the perforated member (1) having improved interior concealing properties due to the first protruding portions (4) arranged around the holes (3) and also having an aesthetic appearance.

Further, in the perforated member (1) of the present embodiment, the arrangement pitch h of the holes (3) and the arrangement pitch a of the first protruding portions (4) are set to be equal to each other. This also enables providing the perforated member (1) having improved interior concealing properties due to the first protruding portions (4) arranged around the holes (3) and also having an aesthetic appearance.

Further, in the perforated member (1) of the present embodiment, the tops (4a) of the first protruding portions (4) are rounded. This allows the perforated member (1) applied to, for example, an air-permeable cover to exhibit a rectifying effect, thereby reducing intake/exhaust noises.

Further, in the perforated member (1) of the present embodiment, the opening edges (3a) of the holes (3) are rounded. This avoids sharpening the opening edges (3a) of the holes (3), so that dust and the like are not trapped on the edges, unlike the cover using the known perforated metal. This facilitates cleaning.

In the perforated member (1) of the present embodiment, the height H of the top (4a) of the first protruding portion (4) is set to be equal to or higher than 20% of the thickness D of the base (5). The first protruding portions (4) arranged around the holes (3) thus allow further narrowing a viewing angle at which an area beyond the substrate (2) is seen through the holes (3).

Further, in the perforated member (1) of the present embodiment, the thickness of the substrate (2) is changed along the circumferential direction of the holes (3). This enables providing the perforated member (1) having improved interior concealing properties and also having an aesthetic appearance.

In addition, when the perforated member (1) of the present embodiment is manufactured by resin-molding using an injection method with D3 Texture (registered trademark), the arrangement of the first protruding portions (4) enables providing regular large undulations. In contract, the known processing method such as etching or blasting can only form a contingency, randomly undulated shape, such as an embossed texture. Thus, it is difficult to narrow the viewing angle at which an area beyond the substrate (2) is seen through the holes (3).

Variation of First Embodiment

Figure 5:
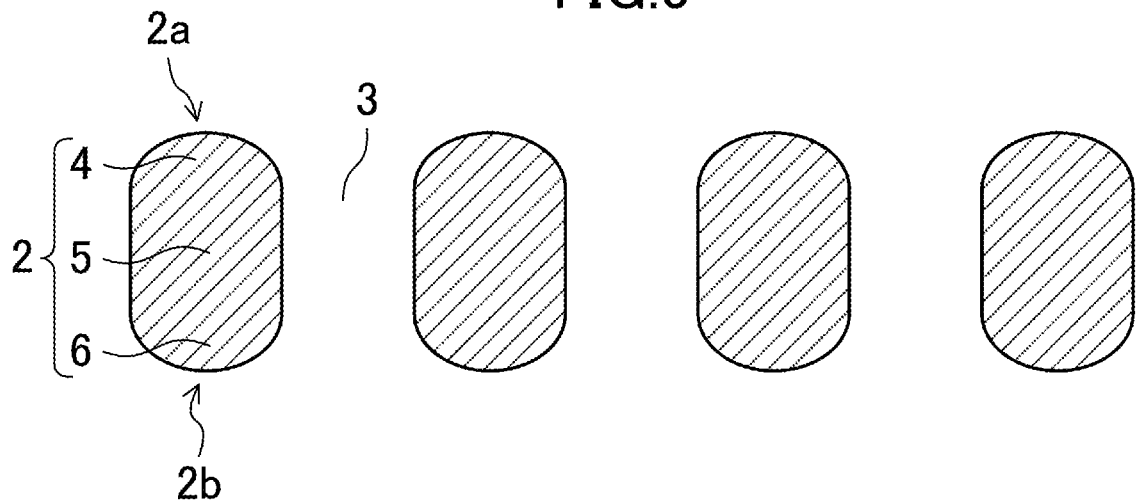
FIG. 5 is a cross-sectional view of a perforated member of a variation of the first embodiment.

The present variation is different from the first embodiment in that the substrate (2) has a plurality of second protruding portions (6) on the second surface (2b) on the side opposite to the first surface (2a), as shown in FIG. 5. In other words, the substrate (2) of the present variation has the first protruding portions (4), the base (5), and the second protruding portions (6). The base (5) has a thickness equal to the minimum thickness of the substrate (2). The second protruding portions (6) are arranged in regions between the holes (3) on the second surface (2b) in accordance with the arrangement of the holes (3). The second protruding portions (6) may differ from the first protruding portions (4) in shape, arrangement, and the like.

In this variation, the second protruding portions (6) are provided in the regions between the holes (3) on the second surface (2b) on the side opposite to the first surface (2a) on which the first protruding portions (4) are formed, in accordance with the arrangement of the holes (3). In other words, the second protruding portions (6) are arranged with consideration of the arrangement of the holes (3). The second protruding portions (6) arranged around the holes (3) allows further narrowing a viewing angle at which an area beyond the substrate (2) is seen through the holes (3).

Figure 6:
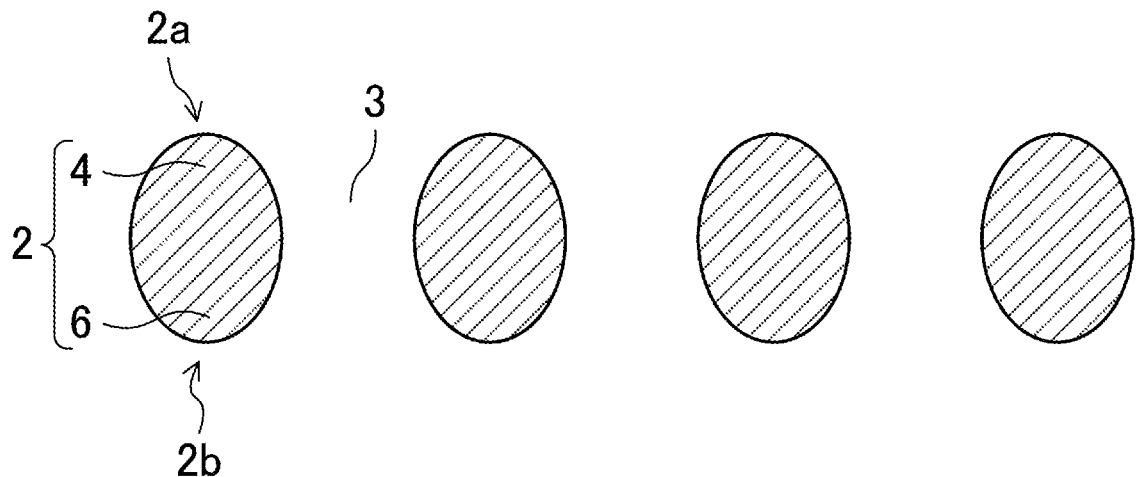
FIG. 6 is a cross-sectional view of a perforated member of another variation of the first embodiment.

As shown in FIG. 6, the present variation may have a configuration where the substrate (2) is comprised of the first protruding portions (4) and the second protruding portions (6) without providing the base (5) of the substrate (2). In this case, the area of each of the holes (3) is changed in a normal direction of the first surface (2a). In this case, at least a part of an inner wall surface of each of the holes (3) at a position where the area of the hole (3) is the smallest is preferably configured as a curved surface expanding toward the inside of the hole (3), as shown in FIG. 6, for example. This allows the perforated member (1) applied to, for example, an air-permeable cover to exhibit a rectifying effect, thereby reducing intake/exhaust noises.

Second Embodiment

Configuration of Perforated Member

Figure 7:
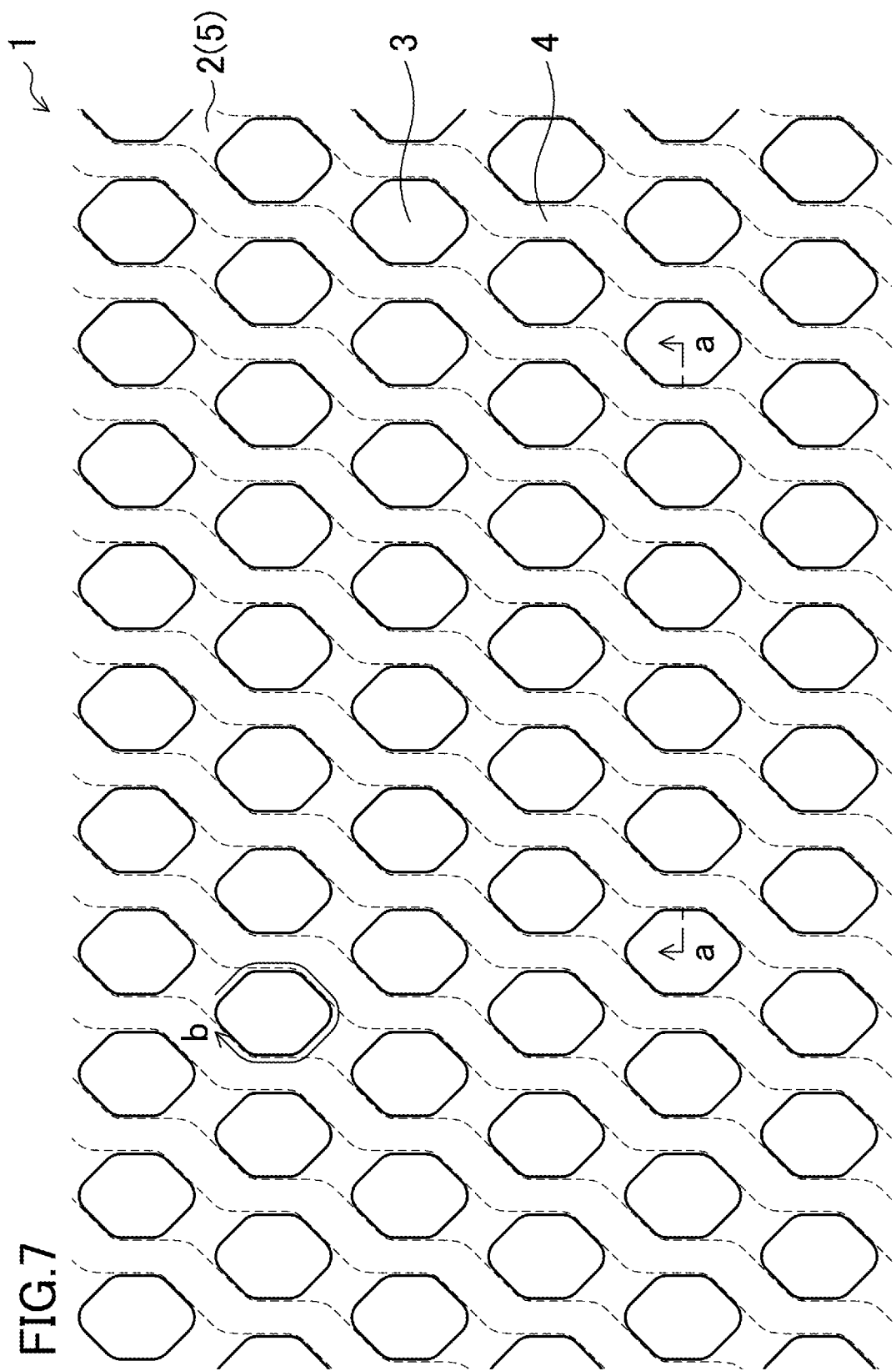
FIG. 7 is a plan view of a perforated member of a second embodiment.
Figure 8:
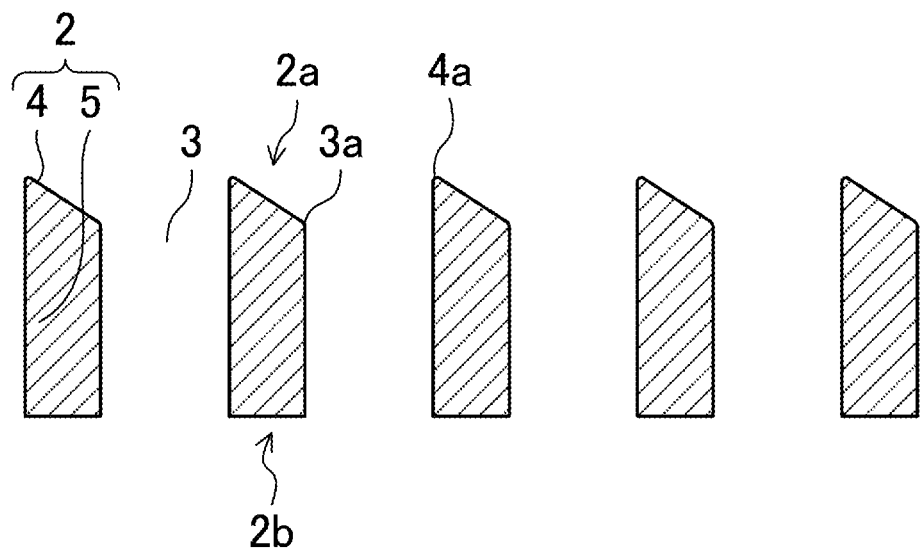
FIG. 8 is a cross-sectional view taken along line a-a shown in FIG. 7.

As shown in FIGS. 7 and 8, a perforated member (1) of the present embodiment includes a substrate (2) having a plurality of holes (3) regularly arranged in two dimensions. The material of the substrate (2) is, for example, resin. The holes (3) having hexagonal opening shapes with rounded corners are arranged zigzag. An opening edge (3a) of each of the holes (3) is rounded.

The substrate (2) has a first surface (2a) on which one end of each of the holes (3) is open, and the first surface (2a) has a plurality of first protruding portions (4). The first protruding portions (4) are regularly arranged in two dimensions in regions between the holes (3) on the first surface (2a) of the substrate (2) in accordance with the arrangement of the holes (3). In other words, the first protruding portions (4) are arranged with consideration of the arrangement of the holes (3). A top (4a) of each of the first protruding portions (4) is rounded.

The substrate (2) has a base (5) having the first protruding portions (4) provided thereon. The base (5) has a thickness equal to the minimum thickness of the substrate (2). The side of the base (5) opposite to the first protruding portions (4), i.e., a second surface (2b) on the side opposite to the first surface (2a) in the substrate (2) is a flat surface except for the regions where the holes (3) are formed.

In the present embodiment, the first protruding portions (4) are regularly arranged in two dimensions in accordance with the arrangement of the holes (3). Specifically, each of the holes (3) having a hexagonal opening shape has a higher side and a lower side facing each other, and the hexagonal opening shape is inclined from the higher side toward the lower side, and the highest end of the higher side is a top (4a) of the first protruding portion (4), and a plane between the top (4a) and the lower side of the hexagonal opening of the adjacent hole (3) is an inclined surface of the first protruding portion (4). When the arrangement pitch of the holes (3) is h and the arrangement pitch of the first protruding portions (4) is a, h=a.

As shown in FIG. 7, the first protruding portions (4) may extend between pairs of adjacent holes (3) along the zigzag arrangement of the holes (3).

When the height of the top (4a) of the first protruding portion (4) is H and the thickness of the base (5) of the first protruding portion (4) is D, H is equal to or higher than 20% of D. Specifically, when the holes (3) are formed in the substrate (2) at an opening ratio of about 55%, D may be 1.5 mm and H may be 0.8 mm.

Figure 9:
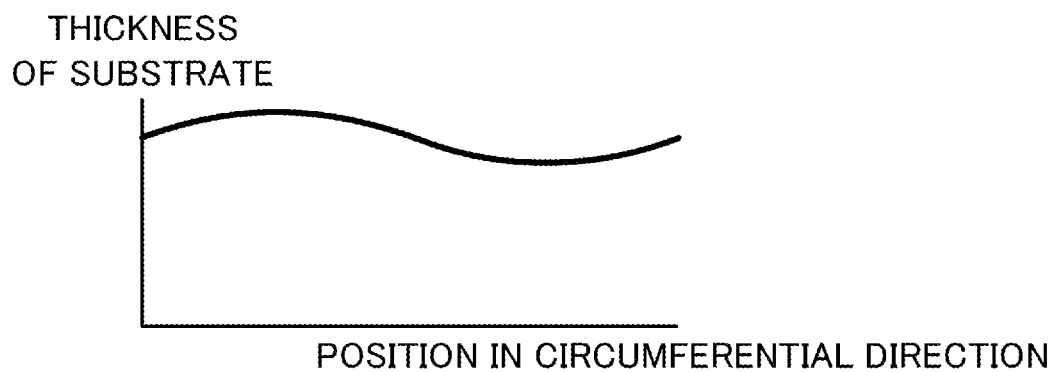
FIG. 9 shows a change in thickness of a substrate around holes in the perforated member of the second embodiment.

Further, the hexagonal opening shape of each of the holes (3) is inclined from its higher side toward its lower side. Thus, the thickness of the substrate (2) is changed along the circumferential direction (see an arrow b in FIG. 7) of the holes (3), as shown in FIG. 9.

As described above, the perforated member (1) of the present embodiment is provided with the plurality of first protruding portions (4) in accordance with the arrangement of the plurality of holes (3). Thus, relatively large undulations are regularly formed on the first surface (2a) of the substrate (2), relative to the thickness of the substrate (2). Such a perforated member (1) can be manufactured by resin-molding using an injection method with a mold made based on D3 Texture (registered trademark), for example.

Advantages of Second Embodiment

According to the perforated member (1) of the present embodiment described above, the first protruding portions (4) are arranged in regions between the holes (3) on the first surface (2a) of the substrate (2) in accordance with the arrangement of the holes (3). In other words, the first protruding portions (4) are arranged with consideration of the arrangement of the holes (3). The first protruding portions (4) arranged around the holes (3) allows narrowing a viewing angle at which an area beyond the substrate (2) is seen through the holes (3). In other words, when the perforated member (1) is viewed obliquely from the first surface (2a) of the substrate (2), the holes (3) are blocked by the first protruding portions (4). Therefore, the perforated member (1) having excellent interior concealing properties is provided even with an increased opening ratio. When such a perforated member (1) is used as, for example, an exterior cover, internal components are less likely to be seen through the holes (3), which improves designability.

In addition, according to the perforated member (1) of the present embodiment, the diameters of the holes (3) are not decreased, but the first protruding portions (4) are provided around the holes (3). This increases the substantial depth of each of the holes (3) and improves the interior concealing properties of the perforated member (1). Therefore, as compared with a method such as that of Patent Document 1 where the hole diameter is reduced to make the perforated state invisible from the outward appearance, the perforated member (1) of the present embodiment is able to be manufactured without restrictions of the strength of the mold pin while the reduction in the opening ratio is suppressed.

In addition, in the perforated member (1) of the present embodiment, the first protruding portions (4) are provided in the regions between the holes (3) even when the opening ratio of the perforated member (1) is increased by forming multiple holes (3) or increasing the diameter of the holes (3), thereby improving the rigidity of the perforated member (1).

This allows the perforated member (1) of the present embodiment to be manufactured without restrictions of the strength of the mold pin while the amount of the material such as resin of the substrate (2) is reduced, as compared with the case in which the thickness of the substrate (2) is made uniformly large to improve the rigidity of the perforated member (1).

In addition, in the perforated member (1) of the present embodiment, the first protruding portions (4) are provided on the first surface (2a) of the substrate (2). Thus, flat portions, depressions, or the holes (3) are surrounded by the first protruding portions (4), thereby forming dimple shapes on the first surface (2a). Therefore, the perforated member (1) applied to, for example, an air-permeable cover exhibits a rectifying effect on airflow in a direction parallel to the first surface (2a), thereby reducing intake/exhaust noises.

Further, in the perforated member (1) of the present embodiment, the holes (3) and the first protruding portions (4) are regularly arranged. This enables providing the perforated member (1) having improved interior concealing properties due to the first protruding portions (4) around the holes (3) and also having an aesthetic appearance.

Further, in the perforated member (1) of the present embodiment, the arrangement pitch h of the holes (3) and the arrangement pitch a of the first protruding portions (4) are set to be equal to each other. This also enables providing the perforated member (1) having improved interior concealing properties due to the first protruding portions (4) around the holes (3) and also having an aesthetic appearance.

Further, in the perforated member (1) of the present embodiment, the tops (4a) of the first protruding portions (4) are rounded. This allows the perforated member (1) applied to, for example, an air-permeable cover to exhibit a rectifying effect, thereby reducing intake/exhaust noises.

Further, in the perforated member (1) of the present embodiment, the opening edges (3a) of the holes (3) are rounded. This avoids sharpening the opening edges (3a) of the holes (3), so that dust and the like are not trapped on the edges, unlike the cover using the known perforated metal. This facilitates cleaning.

In the perforated member (1) of the present embodiment, the height H of the top (4a) of the first protruding portion (4) is set to be equal to or higher than 20% of the thickness D of the base (5). The first protruding portions (4) arranged around the holes (3) allow further narrowing a viewing angle at which an area beyond the substrate (2) is seen through the holes (3).

Further, in the perforated member (1) of the present embodiment, the thickness of the substrate (2) is changed along the circumferential direction of the holes (3). This enables providing the perforated member (1) having improved interior concealing properties and also having an aesthetic appearance.

In addition, when the perforated member (1) of the present embodiment is manufactured by resin-molding using an injection method with D3 Texture (registered trademark), the arrangement of the first protruding portions (4) enables providing regular large undulations. In contract, the known processing method such as etching or blasting can only form a contingency, randomly undulated shape, such as an embossed texture. Thus, it is difficult to narrow the viewing angle at which an area beyond the substrate (2) is seen through the holes (3).

Variation of Second Embodiment

The present variation is different from the second embodiment in that the substrate (2) has a plurality of second protruding portions (6) on the second surface (2b) on the side opposite to the first surface (2a) (see FIG. 5). The second protruding portions (6) are arranged in regions between the holes (3) on the second surface (2b) in accordance with the arrangement of the holes (3). The second protruding portions (6) may differ from the first protruding portions (4) in shape, arrangement, and the like.

In this variation, the second protruding portions (6) are provided in the regions between the holes (3) on the second surface (2b) on the side opposite to the first surface (2a) on which the first protruding portions (4) are formed, in accordance with the arrangement of the holes (3). In other words, the second protruding portions (6) are arranged with consideration of the arrangement of the holes (3). The second protruding portions (6) arranged around the holes (3) allows further narrowing a viewing angle at which an area beyond the substrate (2) is seen through the holes (3).

In this variation, the present variation may have a configuration where the substrate (2) is comprised of the first protruding portions (4) and the second protruding portions (6) without providing the base (5) of the substrate (2) (see FIG. 6).

Third Embodiment

Configuration of Perforated Member

Figure 10:
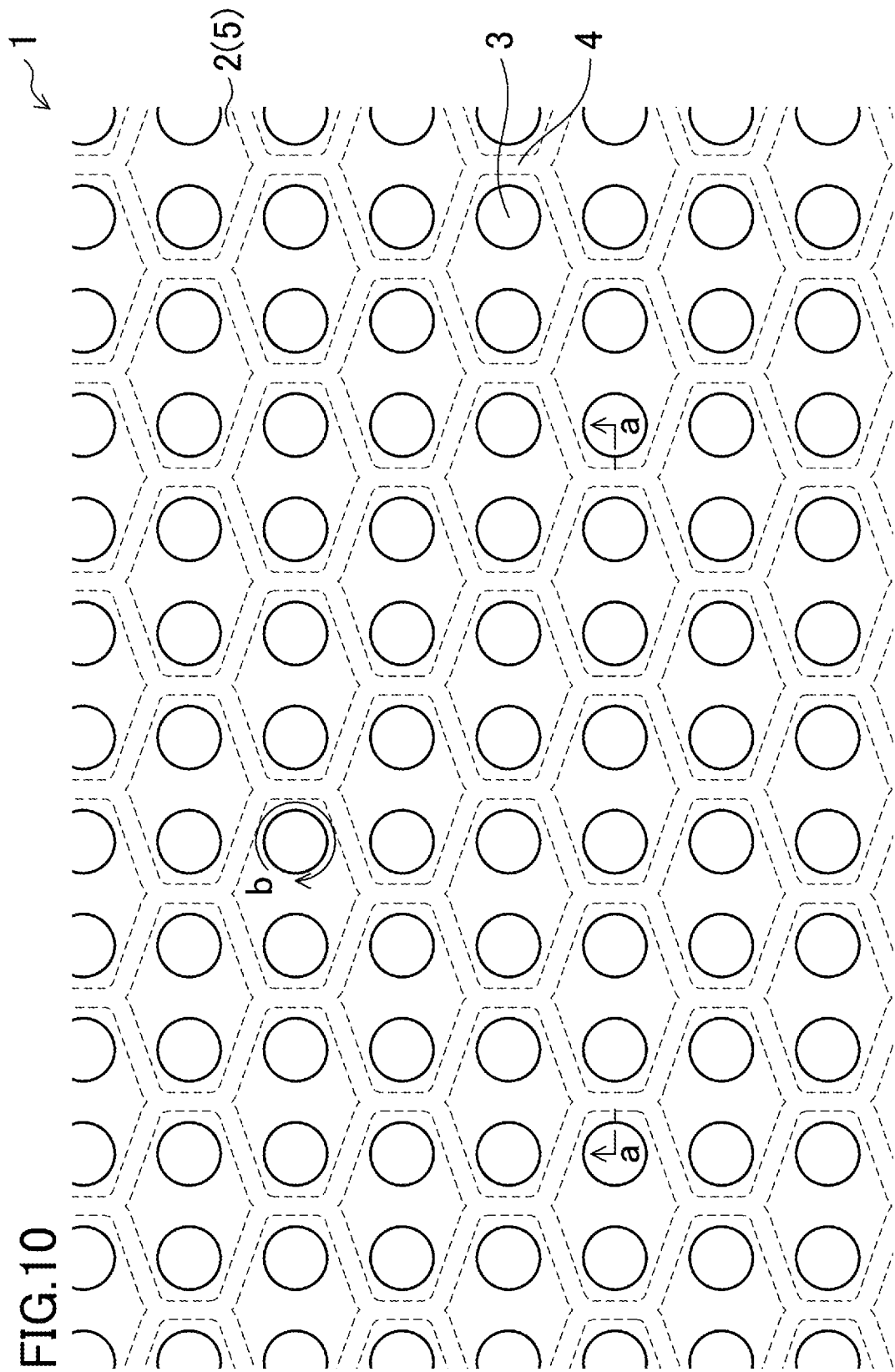
FIG. 10 is a plan view of a perforated member of a third embodiment.
Figure 11:
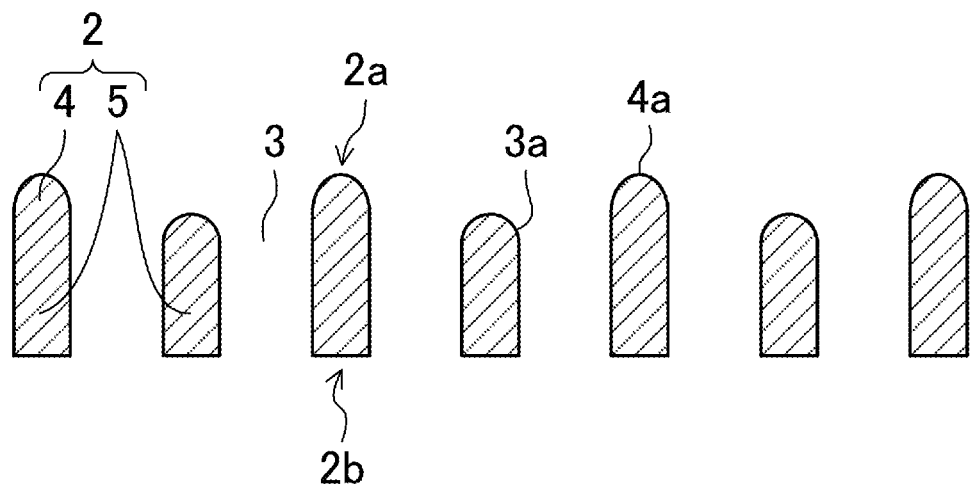
FIG. 11 is a cross-sectional view taken along line a-a shown in FIG. 10.

As shown in FIGS. 10 and 11, a perforated member (1) of the present embodiment includes a substrate (2) having a plurality of holes (3) regularly arranged in two dimensions. The material of the substrate (2) is, for example, resin. The holes (3) have circular or substantially circular shapes and are arranged in a matrix. An opening edge (3a) of each of the holes (3) is rounded.

The substrate (2) has a first surface (2a) on which one end of each of the holes (3) is open, and the first surface (2a) has a plurality of first protruding portions (4). The first protruding portions (4) are regularly arranged in two dimensions in regions between the holes (3) on the first surface (2a) of the substrate (2) in accordance with the arrangement of the holes (3). In other words, the first protruding portions (4) are arranged with consideration of the arrangement of the holes (3). A top (4a) of each of the first protruding portions (4) is rounded.

The substrate (2) has a base (5) having the first protruding portions (4) provided thereon. The base (5) has a thickness equal to the minimum thickness of the substrate (2). The side of the base (5) opposite to the first protruding portions (4), i.e., a second surface (2b) on the side opposite to the first surface (2a) in the substrate (2) is a flat surface except for the regions where the holes (3) are formed.

In the present embodiment, the first protruding portions (4) are regularly arranged in two dimensions in accordance with the arrangement of the holes (3). Specifically, each of the first protruding portions (4) is provided to surround a pair of adjacent holes (3). A first protruding portion (4) is not provided in a region between the adjacent holes (3) of each pair. When the arrangement pitch of the holes (3) is h and the arrangement pitch of the first protruding portions (4) is a, $2h=a$.

As shown in FIG. 10, the first protruding portions (4) each surrounding a pair of adjacent holes (3) may be connected to each other across the plurality of pairs of holes (3) to form a single mesh-like protruding structure over the entire surface of the substrate (2).

When the height of the top (4a) of the first protruding portion (4) is H and the thickness of the base (5) of the first protruding portion (4) is D, H is equal to or higher than 20% of D. Specifically, when the holes (3) are formed in the substrate (2) at an opening ratio of about 55%, D may be 1.5 mm and H may be 0.8 mm.

Figure 12:
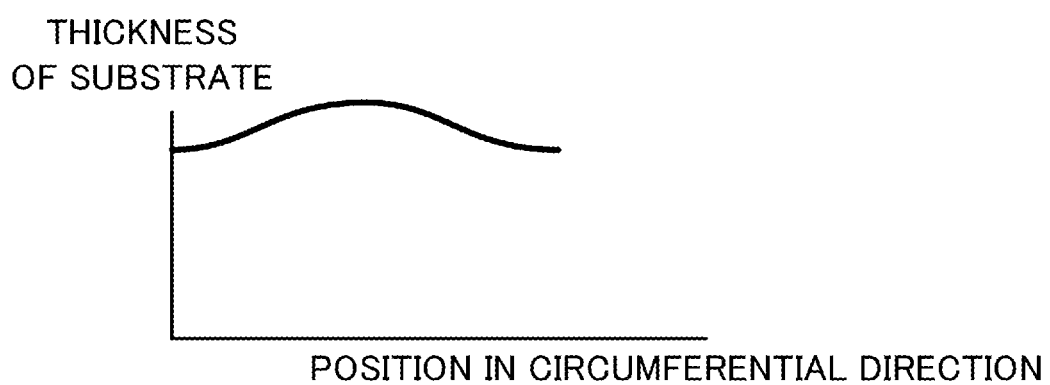
FIG. 12 shows a change in thickness of a substrate around holes in the perforated member of the third embodiment.

In addition, each of the first protruding portions (4) surrounds each pair of adjacent holes (3) while no first protruding portion (4) is provided in the region between the two holes (3) of each pair, the thickness of the substrate (2) is changed along the circumferential direction (see an arrow b in FIG. 10) of the holes (3), as shown in FIG. 12.

As described above, the perforated member (1) of the present embodiment is provided with the plurality of first protruding portions (4) in accordance with the arrangement of the plurality of holes (3). Thus, relatively large undulations are regularly formed on the first surface (2a) of the substrate (2), relative to the thickness of the substrate (2). Such a perforated member (1) can be manufactured by resin-molding using an injection method with a mold made based on D3 Texture (registered trademark), for example.

Advantages of Third Embodiment

In the perforated member (1) of the present embodiment described above, each of the first protruding portions (4) is arranged to surround each pair of adjacent holes (3) on the first surface (2a) of the substrate (2). Thus, the first protruding portions (4) arranged around each pair of holes (3) allows narrowing a viewing angle at which an area beyond the substrate (2) is seen through the holes (3). In other words, when the perforated member (1) is viewed obliquely from the first surface (2a) of the substrate (2), the holes (3) are blocked by the first protruding portions (4). Therefore, the perforated member (1) having excellent interior concealing properties is provided even with an increased opening ratio. When such a perforated member (1) is used as, for example, an exterior cover, internal components are less likely to be seen through the holes (3), which improves designability.

In addition, according to the perforated member (1) of the present embodiment, the diameters of the holes (3) are not decreased, but the first protruding portions (4) are provided around the holes (3). This increases the substantial depth of each of the holes (3) and improves the interior concealing properties of the perforated member (1). Therefore, as compared with a method such as that of Patent Document 1 where the hole diameter is reduced to make the perforated state invisible from the outward appearance, the perforated member (1) of the present embodiment is able to be manufactured without restrictions of the strength of the mold pin while the reduction in the opening ratio is suppressed.

In addition, in the perforated member (1) of the present embodiment, the first protruding portions (4) are provided in the regions between the holes (3) even when the opening ratio of the perforated member (1) is increased by forming multiple holes (3) or increasing the diameter of the holes (3), thereby improving the rigidity of the perforated member (1). This allows the perforated member (1) of the present embodiment to be manufactured without restrictions of the strength of the mold pin while the amount of the material such as resin of the substrate (2) is reduced, as compared with the case in which the thickness of the substrate (2) is made uniform to improve the rigidity of the perforated member (1).

In addition, in the perforated member (1) of the present embodiment, the first protruding portions (4) are provided on the first surface (2a) of the substrate (2). Thus, flat portions, depressions, or the holes (3) are surrounded by the first protruding portions (4), thereby forming dimple shapes on the first surface (2a). Therefore, the perforated member (1) applied to, for example, an air-permeable cover exhibits a rectifying effect on airflow in a direction parallel to the first surface (2a), thereby reducing intake/exhaust noises.

Further, in the perforated member (1) of the present embodiment, the holes (3) and the first protruding portions (4) are regularly arranged. This enables providing the perforated member (1) having improved interior concealing properties due to the first protruding portions (4) around the holes (3) and also having an aesthetic appearance.

Further, in the perforated member (1) of the present embodiment, the arrangement pitch of the holes (3) is h, and the arrangement pitch a of the first protruding portions (4) is set to be equal to 2 h. This enables providing the perforated member (1) having improved interior concealing properties due to the first protruding portions (4) surrounding the respective pairs of adjacent holes (3) and also having an aesthetic appearance.

Further, in the perforated member (1) of the present embodiment, the tops (4a) of the first protruding portions (4) are rounded. This allows the perforated member (1) applied to, for example, an air-permeable cover to exhibit a rectifying effect, thereby reducing intake/exhaust noises.

Further, in the perforated member (1) of the present embodiment, the opening edges (3a) of the holes (3) are rounded. This avoids sharpening the opening edges (3a) of the holes (3), so that dust and the like are not trapped on the edges, unlike the cover using the known perforated metal. This facilitates cleaning.

In the perforated member (1) of the present embodiment, the height H of the top (4a) of the first protruding portion (4) is set to be equal to or higher than 20% of the thickness D of the base (5). The first protruding portions (4) arranged around the respective pairs of adjacent holes (3) allows further narrowing a viewing angle at which an area beyond the substrate (2) is seen through the holes (3).

Further, in the perforated member (1) of the present embodiment, the thickness of the substrate (2) is changed along the circumferential direction of the holes (3). This enables providing the perforated member (1) having improved interior concealing properties and also having an aesthetic appearance.

In addition, when the perforated member (1) of the present embodiment is manufactured by resin-molding using an injection method with D3 Texture (registered trademark), the arrangement of the first protruding portions (4) enables providing regular large undulations. In contract, the known processing method such as etching or blasting can only form a contingency, randomly undulated shape, such as an embossed texture. Thus, it is difficult to narrow the viewing angle at which an area beyond the substrate (2) is seen through the holes (3).

Variation of Third Embodiment

The present variation is different from the third embodiment in that the substrate (2) has a plurality of second protruding portions (6) on the second surface (2b) on the side opposite to the first surface (2a) (see FIG. 5). The second protruding portions (6) are arranged in regions between the holes (3) on the second surface (2b) in accordance with the arrangement of the holes (3). The second protruding portions (6) may differ from the first protruding portions (4) in shape, arrangement, and the like.

In this variation, the second protruding portions (6) are provided in the regions between the holes (3) on the second surface (2b) on the side opposite to the first surface (2a) on which the first protruding portions (4) are formed, in accordance with the arrangement of the holes (3). In other words, the second protruding portions (6) are arranged with consideration of the arrangement of the holes (3). The second protruding portions (6) arranged around the holes (3) allows further narrowing a viewing angle at which an area beyond the substrate (2) is seen through the holes (3).

In this variation, the present variation may have a configuration where the substrate (2) is comprised of the first protruding portions (4) and the second protruding portions (6) without providing the base (5) of the substrate (2) (see FIG. 6).

Other Embodiments

In the perforated member (1) of the present disclosure, the shapes, arrangements, and the like of the holes (3), the first protruding portions (4), and the second protruding portions (6) are not limited to those of the foregoing first to third embodiments and the variations thereof as long as the first protruding portions (4) and the second protruding portions (6) are arranged in accordance with the arrangement of the holes (3). For example, a configuration in which at least one hole (3) is surrounded by at least one first protruding portion (4) or second protruding portion (6), or a configuration in which an array of holes (3) along a predetermined direction is interposed between the first protruding portions (4) or second protruding portions (6) extending in the predetermined direction on both sides of the array of holes (3) may also exhibit the same advantages as those of the foregoing first to third embodiments and the variations thereof. In addition, the first protruding portion (4) may be connected to each other and the second protruding portion (6) may be connected to each other to form a single protruding structure over the entire surface of the substrate (2).

Figure 13:
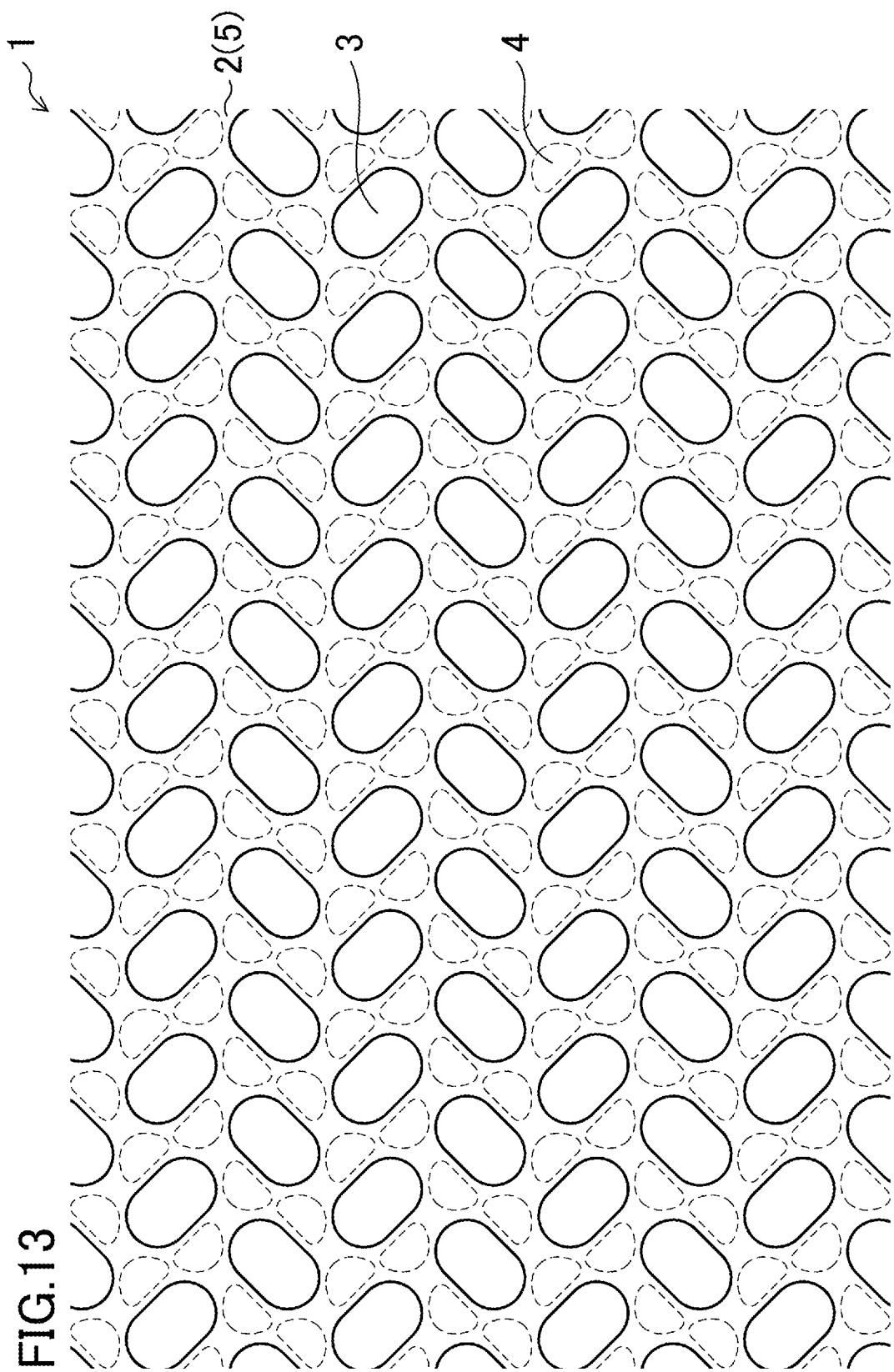
FIG. 13 is a plan view of a perforated member of another embodiment.

More specifically, as shown in FIG. 13, the hole (3) having rounded rectangular opening shapes whose short sides are arcs may be arranged zigzag, and the opening direction of the holes (3) may differ in each row of holes (3). In addition, a plurality of (e.g., two) first protruding portions (4) may be disposed between adjacent holes (3). In the perforated member (1) shown in FIG. 13, each of holes (3) is surrounded by six first protruding portions (4).

Figure 14:
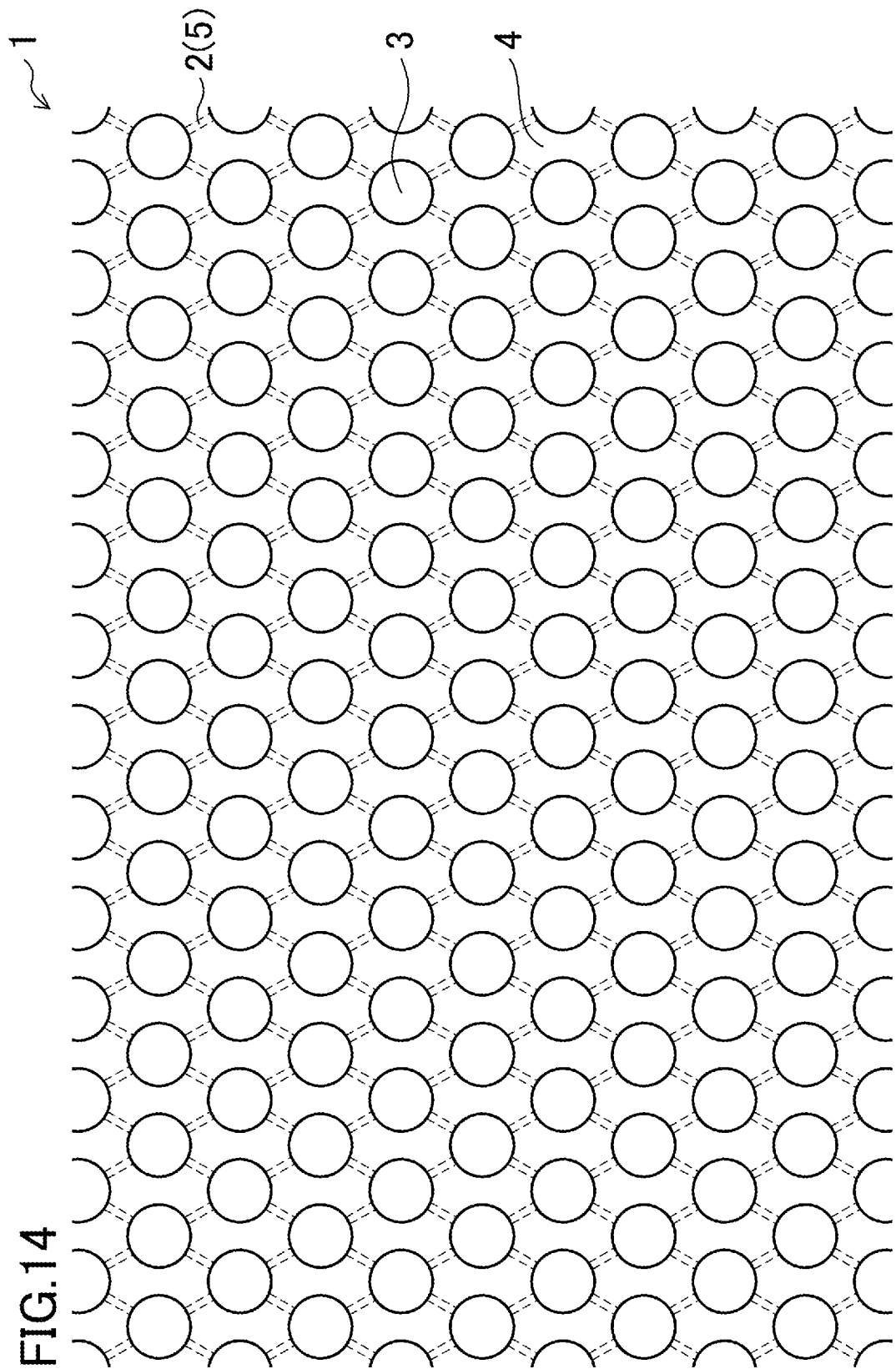
FIG. 14 is a plan view of a perforated member of another embodiment.

Further, as shown in FIG. 14, holes (3) having circular or substantially circular opening shapes may be arranged zigzag, and one first protruding portion (4) may be arranged in a region surrounded by four adjacent holes (3) such that the center of the region is the top of the first protruding portion (4).

Figure 15:
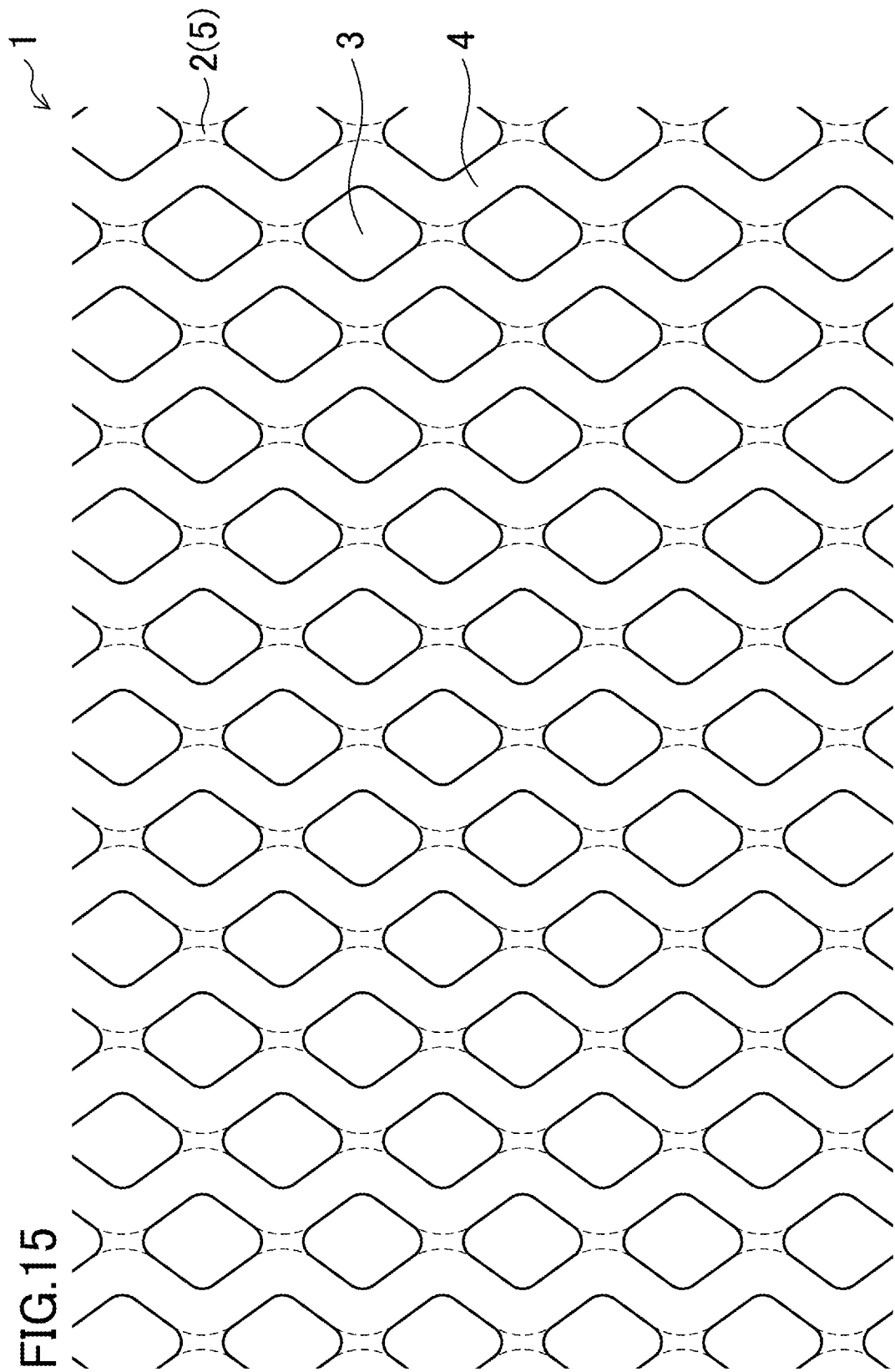
FIG. 15 is a plan view of a perforated member of another embodiment.

As shown in FIG. 15, holes (3) having rhombic or substantially rhombic opening shapes with rounded corners may be arranged zigzag, and each of the first protruding portions (4) extending in the direction of the long axis of the rhombic opening of each of the holes (3) may be arranged in regions between the holes (3). Thus, each of the holes (3) arranged along the long axis of its rhombic opening are interposed between each pair of first protruding portions (4) from both sides in the arrangement direction.

As shown in FIG. 16, holes (3) having hexagonal opening shapes with rounded corners may be arranged zigzag, and the first protruding portions (4) surrounding the holes (3) may be arranged in regions between the holes (3). The top of the first protruding portion (4) is located at the center or substantially the center of the region between the adjacent holes (3).

Further, although not shown, when the perforated member (1) is applied to, for example, an air-permeable cover, each of holes (3) may be surrounded by each first protruding portion (4) to form a funnel shape to improve the air intake capability.

Further, in the foregoing first to third embodiments, the arrangement pitch h of the holes (3) is h, and an arrangement pitch a of the first protruding portions (4) is set to be equal to h or 2h. However, the present invention is not limited thereto. Alternatively, an equation $nh=ma$ (where n and m are integers equal to or higher than 1) is satisfied. This enables providing a perforated member having improved interior concealing properties due to the first protruding portions (4) and also having an aesthetic appearance.

If the holes (3) and the first protruding portions (4) have shapes in each of which the center can be easily recognized, the distance between centers of the adjacent holes (3) or between the adjacent first protruding portions (4) may be set as an arrangement pitch. When the holes (3) and the first protruding portions (4) have shape in each of which the center is difficult to be recognized, the distance between edges of the adjacent holes (3) or the distance between edges of the adjacent first protruding portions (4) may be set as a pitch.

In addition, in the foregoing first to third embodiments and the variations thereof, the holes (3), the first protruding portions (4), and the second protruding portions (6) are regularly arranged in two dimensions. However, the perforated member (1) may have an area where the holes (3), the first protruding portions (4), and the second protruding portions (6) are not regularly arranged.

In the foregoing first to third embodiments, the thickness of the substrate (2) is changed along the circumferential direction of each of the holes (3). However, in a configuration in which three or more holes (3) are surrounded by one first protruding portion (4), for example, there may be a hole (3) in which the thickness of the substrate (2) is not changed along the circumferential direction.

In the foregoing first to third embodiments, the perforated member (1) is manufactured by resin molding using an injection method with resin as a material for the substrate (2). However, a material and a processing method of the substrate (2) are not particularly limited.

The thickness of the substrate (2) is not particularly limited. If resin molding using an injection method is performed, the thickness of the substrate (2) (including the first protruding portions (4) and the second protruding portions (6)) may be, for example, about 0.5 mm or more to about 5.0 mm or less. If the thickness of the substrate (2) is about 1 mm or less, the perforated member (1) including such a substrate (2) can be applied as an exterior cover of a cellular phone, for example. In addition, if the thickness of the substrate (2) is about 2 mm to about 3 mm or thicker, the perforated member (1) including such a substrate (2) can be applied as an exterior cover of a commonly used home electric appliance.

The perforated member (1) of the present disclosure may be applied to an air-permeable member such as an air-permeable cover; an exterior cover and a casing for transmitting sound or light, and the like. In particular, the perforated member (1) of the present disclosure is suitable for a product having an airhole in its exterior, for example, an air conditioner, a speaker, a projector, a personal computer, and the like.

In the foregoing first to third embodiments, the height H of the top (4a) of the first protruding portion (4) is set to be equal to or higher than 20% of the thickness D of the base (5). However, even when the height H is equal to or higher than 10% or 5% of the thickness D, the interior concealing properties are improved as compared with a case providing no first protruding portions (4). Further, within the range of restrictions of the strength and the like of the perforated member (1) and the mold pin, the larger the height H, the larger the degree of improving the interior concealing properties. The height H is set to be more preferably equal to or higher than 30% of the thickness D, yet more preferably equal to or higher than 50% of the thickness D.

While the embodiments and variations have been described above, it will be understood that various changes in form and details can be made without departing from the spirit and scope of the claims. The embodiments, the variations, and the other embodiments may be combined and replaced with each other as long as the functions of the target of the present disclosure are not impaired. In addition, the expressions of "first," "second," and "third" described above are used to distinguish the terms to which these expressions are given, and do not limit the number and order of the terms.

The present disclosure is useful as a perforated member, an air-permeable member, and an air-permeable cover.

The invention claimed is:

1. An air-permeable cover comprising:
a substrate having a plurality of holes,
the substrate having a first surface on which one end of each of the plurality of holes is open, and the first surface having a plurality of first protruding portions,
the substrate having a second surface on a side opposite to the first surface, the second surface having a plurality of second protruding portions,
the plurality of first protruding portions being arranged in regions between the plurality of holes on the first surface in accordance with an arrangement of the plurality of holes,
the plurality of second protruding portions being arranged in regions between the plurality of holes on the second surface in accordance with the arrangement of the plurality of holes, and
the substrate including the plurality of first protruding portion and the plurality of second protruding portions being integrally formed as a one-piece member.

2. The air-permeable cover of claim 1, wherein
the plurality of holes and the plurality of first protruding portions are regularly arranged in two dimensions.

3. The air-permeable cover of claim 2, wherein
when an arrangement pitch of the plurality of holes is h and an arrangement pitch of the plurality of first protruding portions is a, $$nh=ma$$

where n and m are integers equal to or greater than 1.

4. The air-permeable cover of claim 1, wherein
the plurality of first protruding portions each have a top rounded.

5. The air-permeable cover of claim 2, wherein
the plurality of first protruding portions each have a top rounded.

6. The air-permeable cover of claim 3, wherein
the plurality of first protruding portions each have a top rounded.

7. The air-permeable cover of claim 1, wherein
the substrate has a base that has the plurality of first protruding portions thereon, and
the top of each of the plurality of first protruding portions has a height that is equal to or higher than 20% of a thickness of the base.

8. The air-permeable cover of claim 2, wherein
the substrate has a base that has the plurality of first protruding portions thereon, and
the top of each of the plurality of first protruding portions has a height that is equal to or higher than 20% of a thickness of the base.

9. The air-permeable cover of claim 4, wherein
the substrate has a base that has the plurality of first protruding portions thereon, and
the top of each of the plurality of first protruding portions has a height that is equal to or higher than 20% of a thickness of the base.

10. A perforated member comprising:
a substrate having a plurality of holes,
the substrate having a first surface on which one end of each of the plurality of holes is open, and the first surface having a plurality of first protruding portions,
the plurality of first protruding portions being arranged in regions between the plurality of holes on the first surface in accordance with an arrangement of the plurality of holes,
the plurality of holes each having an opening edge rounded, and
the substrate having a thickness that changes along a circumferential direction of at least a part of each of the plurality of holes.

11. A perforated member comprising:
a substrate having a plurality of holes,
the substrate having a first surface on which one end of each of the plurality of holes is open, and the first surface having a plurality of first protruding portions,
the plurality of first protruding portions being arranged in regions between the plurality of holes on the first surface in accordance with an arrangement of the plurality of holes,
the plurality of holes each having an area that changes along a normal direction of the first surface,
at least a part of an inner wall surface of each of the plurality of holes at a position where the area is the smallest being configured as a curved surface expanding toward an inside of each of the plurality of holes, and
the substrate having a thickness that changes along a circumferential direction of at least a part of each of the plurality of holes.

12. A perforated member comprising:
a substrate having a plurality of holes,
the substrate having a first surface on which one end of each of the plurality of holes is open, and the first surface having a plurality of first protruding portions,
the plurality of first protruding portions being arranged in regions between the plurality of holes on the first surface in accordance with an arrangement of the plurality of holes, and
the substrate having a thickness that changes along a circumferential direction of at least a part of each of the plurality of holes.

13. An air-permeable member including the perforated member of claim 10.

14. An air-permeable member including the perforated member of claim 11.

15. An air-permeable member including the perforated member of claim 12.

16. An air-permeable cover including the air-permeable member of claim 13.

17. An air-permeable cover including the air-permeable member of claim 14.

18. An air-permeable cover including the air-permeable member of claim 15.

\* \* \* \* \*